United States Patent
U'Ren

(10) Patent No.: US 7,335,547 B1
(45) Date of Patent: Feb. 26, 2008

(54) METHOD FOR EFFECTIVE BICMOS PROCESS INTEGRATION

(75) Inventor: Greg D. U'Ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 346 days.

(21) Appl. No.: 11/086,168

(22) Filed: Mar. 21, 2005

(51) Int. Cl.
*H01L 21/8238* (2006.01)
(52) U.S. Cl. ............. 438/202; 438/350; 257/E21.696
(58) Field of Classification Search ............ 438/202, 438/234, 350, 356, 357; 257/E21.696
See application file for complete search history.

(56) References Cited

U.S. PATENT DOCUMENTS 4,808,548 A * 2/1989 Thomas et al. ............. 438/234
5,407,841 A * 4/1995 Liao et al. .................. 438/202
6,534,372 B1 * 3/2003 Racanelli .................... 438/321

* cited by examiner

*Primary Examiner*—Chandra Chaudhari
(74) *Attorney, Agent, or Firm*—Farjami & Farjami LLP

(57) ABSTRACT

According to an exemplary embodiment, a method for integrating bipolar and CMOS devices on a substrate, where the substrate includes bipolar and CMOS regions and has a sacrificial oxide layer situated thereon, includes removing a portion of the sacrificial oxide layer in the bipolar region of the substrate to expose a top surface of the substrate. The method includes forming a base layer on the top surface of the substrate in the bipolar region. The base layer forms a bipolar transistor base. The method further includes forming a sacrificial post on the base layer in the bipolar region and at least one gate electrode in the CMOS region of the substrate. A common mask is used to form the sacrificial post and the at least one gate electrode. The method further includes forming LDD regions adjacent to the at least one gate electrode in the CMOS region.

20 Claims, 8 Drawing Sheets

METHOD FOR EFFECTIVE BICMOS PROCESS INTEGRATION

BACKGROUND OF THE INVENTION

1. Field of the Invention

The present invention is generally in the field of semiconductors. More particularly, the invention is in the field of bipolar and CMOS device fabrication.

2. Background Art

As Bipolar Complementary-Metal-Oxide-Semiconductor (BiCMOS) technology continues to advance in an effort to achieve increased device speed and reduced power consumption, it becomes more difficult to integrate high performance bipolar devices, such as high performance NPN transistors, with CMOS devices, such as P-channel FETs (PFETs) and N-channel FETs (NFETs). High performance NPN devices, such as NPN silicon-germanium (SiGe) bipolar transistors, require a high thermal budget for epitaxial SiGe base formation, while CMOS devices require a low thermal budget to preserve dopant profiles after implanted regions, such as lightly doped drain (LDD) regions, have been formed.

In a conventional BiCMOS process flow, gate electrodes are formed in a CMOS region of a substrate, which includes N wells, P wells, and isolation regions. After formation of the gate electrodes, LDD regions are implanted in the substrate adjacent to the gate electrodes. At this point in the conventional BiCMOS process flow, the CMOS devices are substantially completed and bipolar device formation begins in a bipolar region of the substrate. During bipolar device formation, the collector, epitaxial base layer, and polycrystalline silicon emitter are sequentially formed.

However, the formation of the epitaxial base layer, such as a SiGe epitaxial base layer, requires a high thermal budget, which adversely affects the CMOS devices. For example, the high thermal budget required to form the SiGe epitaxial base layer can adversely affect the junction profiles of the previously formed LDD regions adjacent to the gate electrodes in the CMOS region of the substrate. Furthermore, as bipolar and CMOS devices are scaled down in size in advanced BiCMOS processes, CMOS device formation requires an even lower thermal budget to sustain ultra-shallow junction profiles.

Thus, there is a need in the art for a BiCMOS process flow that allows a sufficiently high thermal budget for bipolar device formation without adversely affecting CMOS device formation.

SUMMARY OF THE INVENTION

The present invention is directed to method for effective BiCMOS process integration. The present invention addresses and resolves the need in the art for a BiCMOS process flow that allows a sufficiently high thermal budget for bipolar device formation without adversely affecting CMOS device formation.

According to an exemplary embodiment, a method for integrating bipolar and CMOS devices on a substrate, where the substrate includes bipolar and CMOS regions and has a sacrificial oxide layer situated thereon, includes removing a portion of the sacrificial oxide layer in the bipolar region of the substrate to expose a top surface of the substrate. The method includes forming a base layer on the top surface of the substrate in the bipolar region. The base layer forms a bipolar transistor base. For example, the bipolar transistor base may be a self-aligned NPN transistor base. The base layer may be epitaxial silicon-germanium or silicon-germanium-carbon, for example. The method further includes forming a sacrificial post on the base layer in the bipolar region and at least one gate electrode in the CMOS region of the substrate. A common mask is used to form the sacrificial post and the at least one gate electrode. For example, the common mask may be a phase shift mask.

According to this exemplary embodiment, the method further includes forming LDD regions adjacent to the at least one gate electrode in the CMOS region. The method further includes forming spacers adjacent to the sacrificial post in the bipolar region and adjacent to the at least one gate electrode in the CMOS region. The method further includes forming source/drain regions adjacent to the at least one gate electrode in the CMOS region. The method further includes removing the sacrificial post to form an emitter window opening, and forming an emitter in the emitter window opening. Other features and advantages of the present invention will become more readily apparent to those of ordinary skill in the art after reviewing the following detailed description and accompanying drawings.

DETAILED DESCRIPTION OF THE INVENTION

The present invention is directed to method for effective BiCMOS process integration. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

The present invention involves a process to effectively integrate bipolar devices in a bipolar region of a substrate and CMOS devices, such as NFETs and PFETs, in a CMOS region of the substrate. It is noted that a CMOS region of a substrate as defined in the present application is a region of the substrate that includes NFETs and PFETs that have gates that can comprise a material other than metal. As will be discussed below, by forming a bipolar transistor base prior to formation of FET gates, the present invention's innovative process provides a BiCMOS process that integrates bipolar transistors with FETs in a manner so as to achieve a number of advantages. Although a self-aligned NPN transistor is integrated with an NFET and a PFET to illustrate the invention's BiCMOS process, the present invention also applies to NPN transistors that are not self-aligned, as well as PNP transistors and other types of bipolar transistors.

Figure 1:
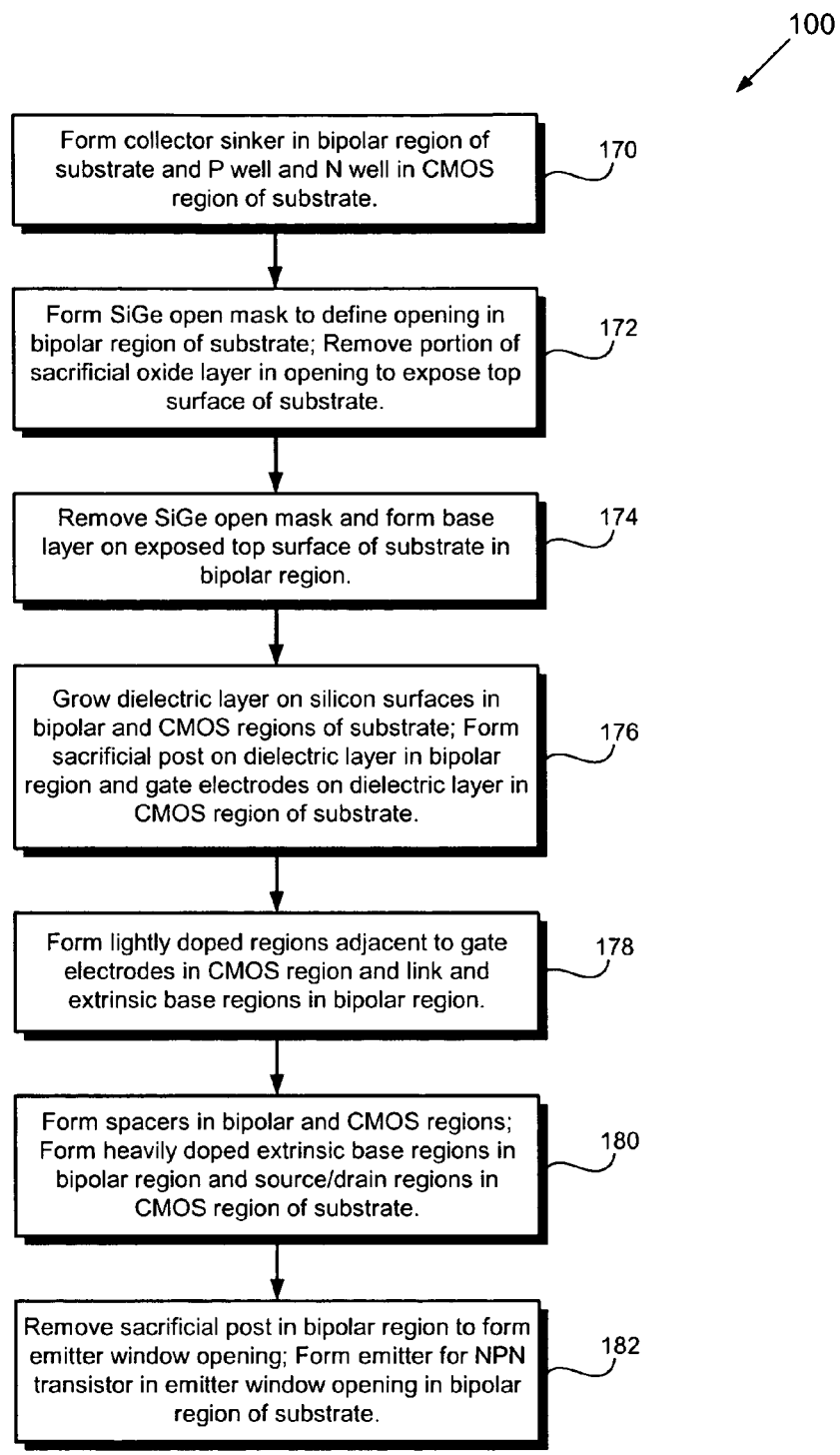
FIG. 1 shows a flowchart illustrating the steps taken to implement an embodiment of the present invention.

FIG. 1 shows a flow chart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 182 indicated in flowchart 100 are sufficient to describe one embodiment of the present invention; however, other embodiments of the invention may utilize steps different from those shown in flowchart 100. It is noted that the processing steps shown in flowchart 100 are performed on a wafer which, prior to step 170 of flowchart 100, includes, among other things, isolation regions, such as shallow trench isolation regions, formed in bipolar and CMOS regions of a substrate, and a buried layer formed in the bipolar region of the substrate.

Moreover, structures 270 through 282 in FIGS. 2A through 2G illustrate the result of performing steps 170 through 182 of flowchart 100, respectively. For example, structure 270 shows a semiconductor structure after processing step 170, structure 272 shows structure 270 after the processing of step 172, structure 274 shows structure 272 after the processing of step 174, and so forth. It is noted that although formation of only one bipolar transistor, i.e. an NPN transistor, and two FETs, i.e. an NFET and a PFET, are specifically discussed herein to preserve brevity, multiple bipolar transistors, such as NPN and PNP transistors, and multiple FETs, such as NFETs and PFETs, may be formed in respective bipolar and CMOS regions of a substrate by utilizing the innovative process of the present invention.

Figure 2A:
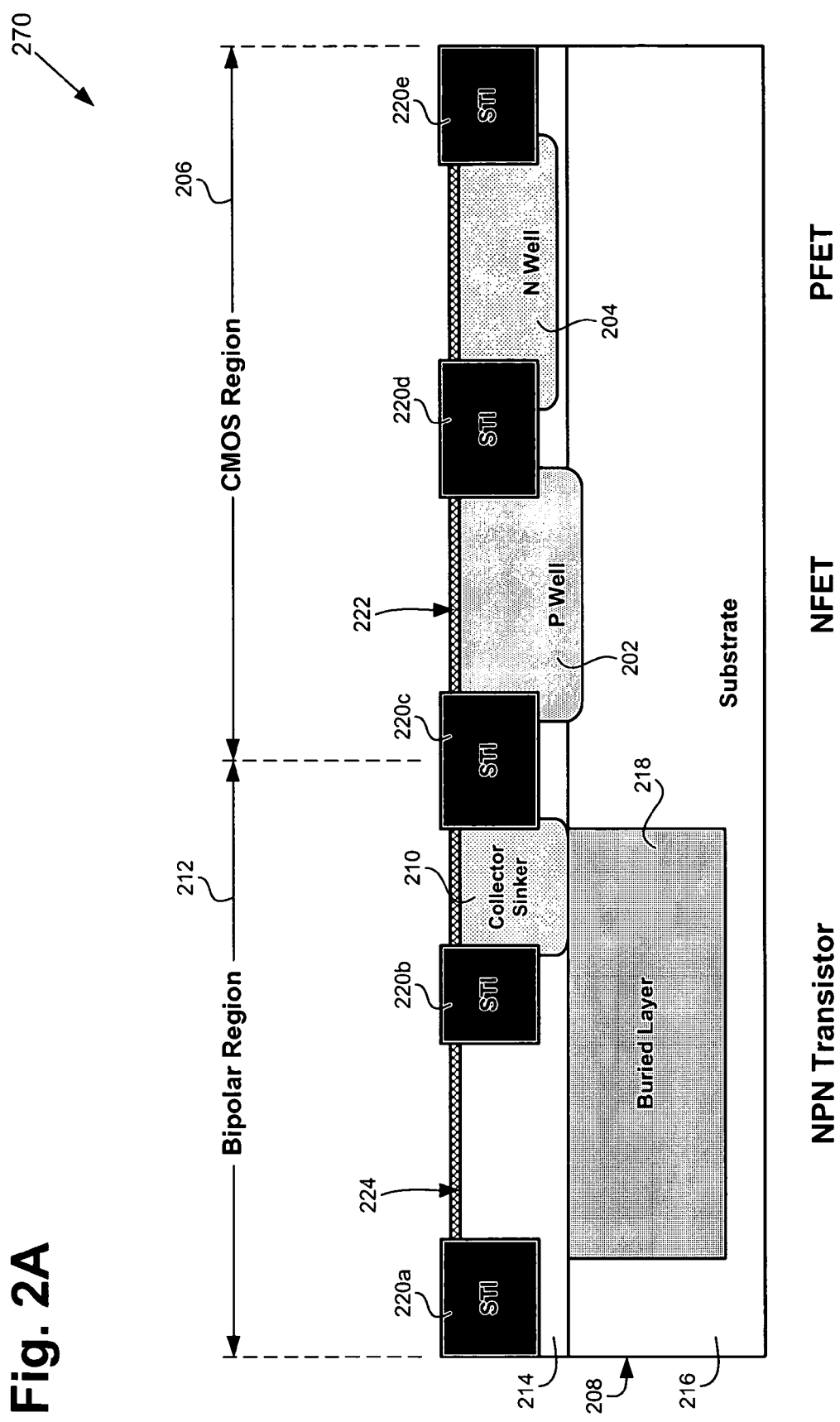
FIG. 2A illustrates a cross-sectional view, which includes a portion of a wafer processed according to an embodiment of the invention, corresponding to an initial step in the flowchart in FIG. 1.

Referring now to FIG. 2A, structure 270 of FIG. 2A shows an exemplary structure including a silicon substrate that includes bipolar and CMOS regions, after completion of step 170 of flowchart 100 in FIG. 1. In structure 270, substrate 208 includes epitaxial layer 214 and bulk silicon layer 216. Epitaxial layer 214 can comprise single-crystal silicon and can be grown on bulk silicon layer 216 by using an epitaxial process. In one embodiment, epitaxial layer 214 may be doped with phosphorus or other appropriate N type dopant. In one embodiment, epitaxial layer 214 may not be formed over bulk silicon layer 216 and, therefore, substrate 208 would only comprise bulk silicon layer 216. In structure 270, buried layer 218 is situated in bipolar region 212 of substrate 208 and can comprise an N+ type region (i.e. relatively heavily doped N type region). Buried layer 218 can be formed by implanting an appropriate N type dopant into a portion of substrate 208.

Also in structure 270, isolation regions 220a, 220b, 220c, 220d, and 220e are situated in substrate 208 and can comprise shallow trench isolation (STI) regions. In other embodiments, isolation regions 220a, 220b, 220c, 220d, and 220e may comprise local oxidation of silicon (LOCOS) or other appropriate isolation material. Also in structure 270, sacrificial oxide layer 222 is situated on top surface 224 of substrate 208 in bipolar region 212 and CMOS region 206 and can comprise silicon oxide. Sacrificial oxide layer 222 can be formed on top surface 224 of substrate 208 by using a chemical vapor deposition (CVD) process or other appropriate processes.

Referring now to step 170 in FIG. 1 and structure 270 in FIG. 2A, at step 170 of flowchart 100, collector sinker 210 is formed in bipolar region 212 and P well 202 and N well 204 are formed in CMOS region 206 of substrate 208. Collector sinker 210 is situated between isolation regions 220b and 220c in bipolar region 212 of substrate 208, P well 202 is situated between isolation regions 220c and 220d in CMOS region 206 of substrate 208, and N well 204 is situated between isolation regions 220d and 220e in CMOS region 206 of substrate 208. N well 204 and collector sinker 210 comprise N type regions, while P well 202 comprises a P type region. N well 204 and collector sinker 210 can be formed by utilizing a well mask to define respective portions of substrate 208 in bipolar region 212 and CMOS region 206, and implant phosphorus or other appropriate N type dopant into the defined portions of substrate 208. P well 202 can be formed by utilizing a field mask to define a portion of substrate 208 in CMOS region 206 and implant boron or other appropriate P type dopant into the defined portion of substrate 208. The result of step 170 of flowchart 100 is illustrated by structure 270 in FIG. 2A.

Figure 2B:
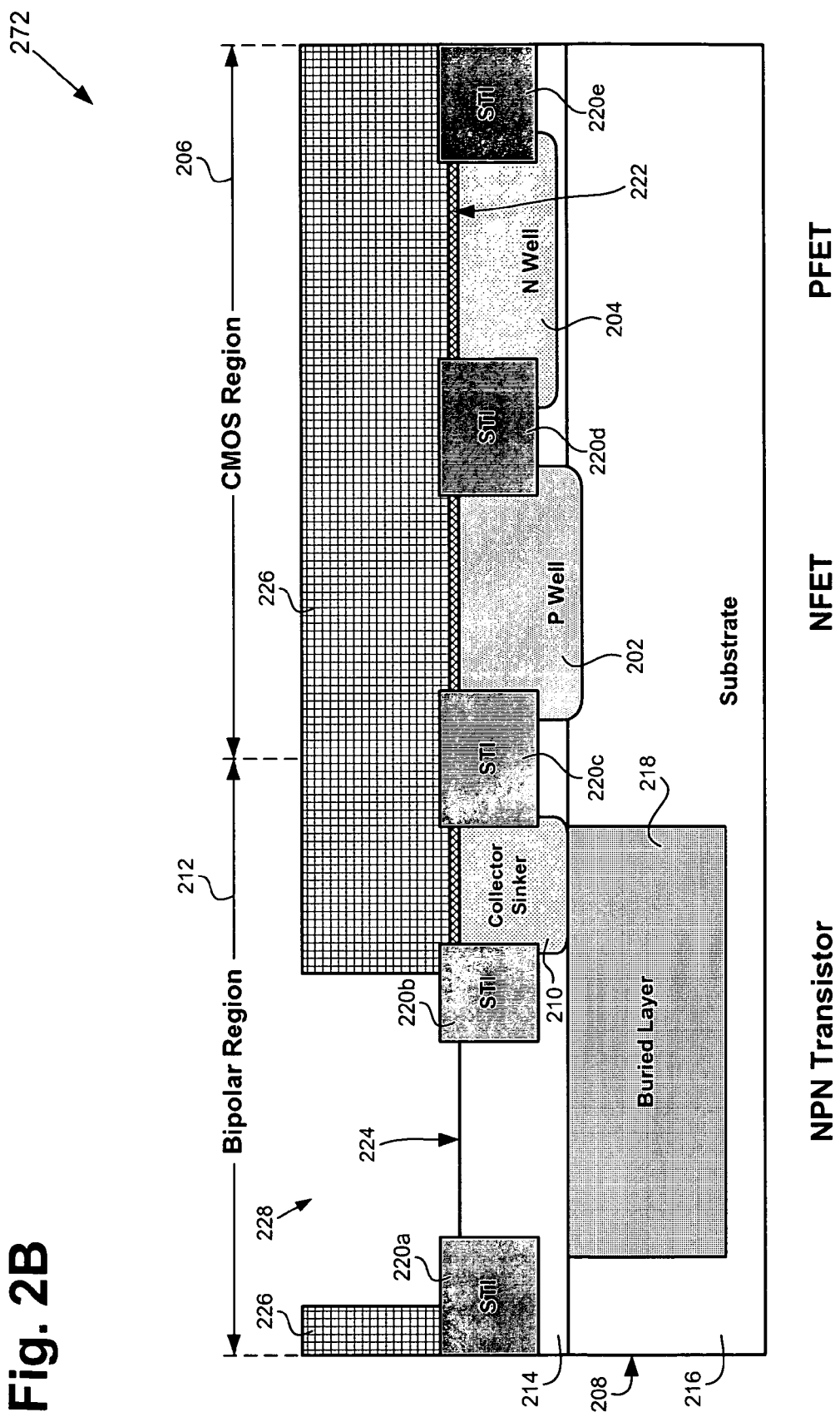
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, SiGe (silicon-germanium) open mask 226 is formed over substrate 208 to define opening 228 in bipolar region 212 and a portion of sacrificial oxide layer 222 situated in opening 228 is removed to expose top surface 224 of substrate 208. SiGe open mask 226 covers CMOS region 206 of substrate 208 and defines opening 228 in bipolar region 212 of substrate 208. SiGe open mask 226 can comprise photoresist or other appropriate masking material and can be formed in a manner know in the art. The portion of sacrificial oxide layer 222 situated in opening 228 can be removed by using an appropriate etch process to expose top surface 224 (i.e. the silicon surface) of substrate 208. The result of step 172 of flowchart 100 is illustrated by structure 272 in FIG. 2B.

Figure 2C:
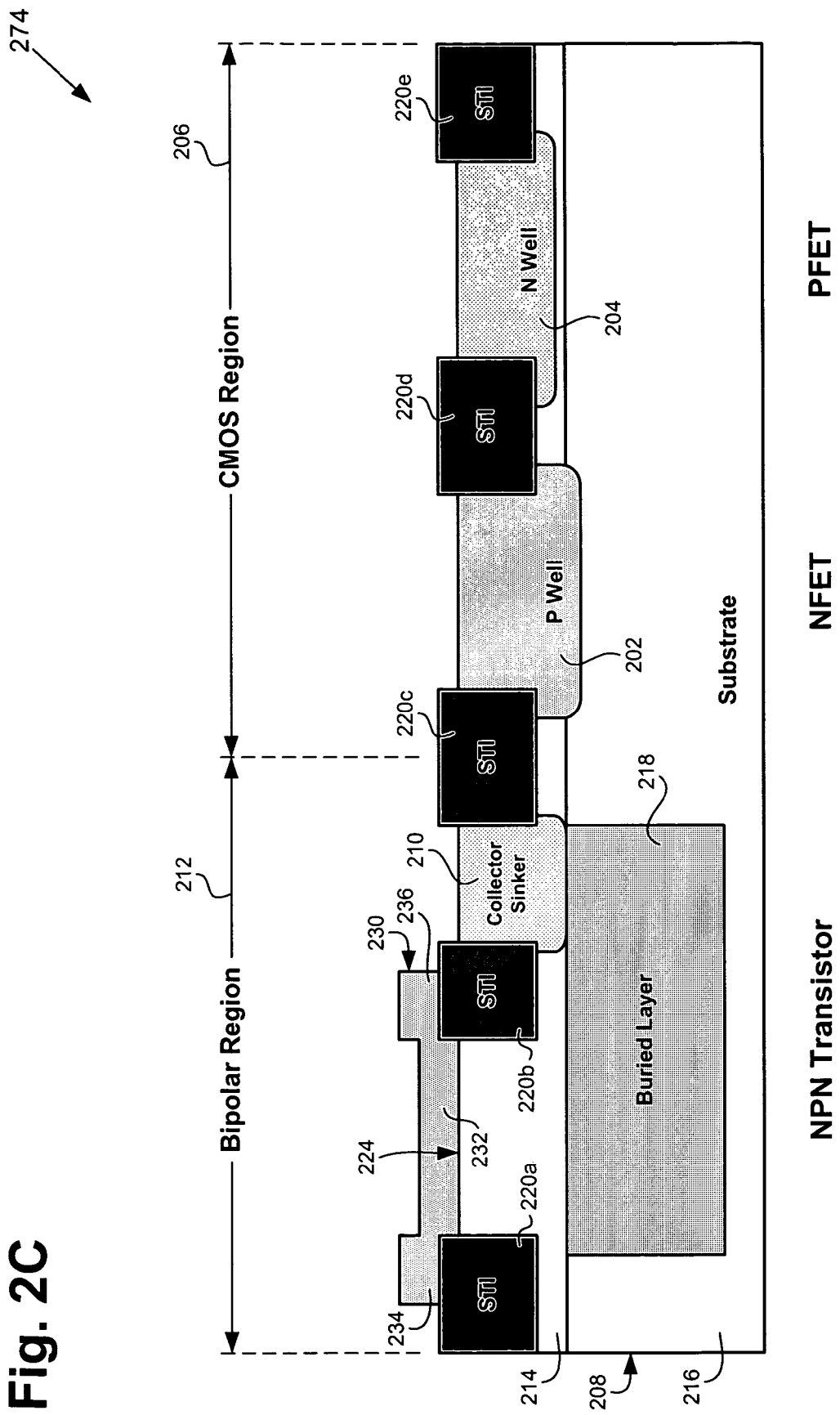
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, SiGe open mask 226 is removed and base layer 230 is formed on top surface 224 of substrate 208 in bipolar region 212. SiGe open mask 226 (shown in FIG. 2B) can be removed by using an appropriate etch process as known in the art. Base layer 230 is situated in bipolar region 212 of substrate 208 and includes base layer segment 232, which is situated on top surface 224 of substrate 208, and base layer segments 234 and 236, which are situated on respective isolation regions 220a and 220b. Base layer segment 232 can comprise epitaxial (i.e. single-crystal) SiGe and base layer segments 234 and 236 can comprise polycrystalline SiGe. In one embodiment, base layer segment 232 may comprise epitaxial silicon-germanium-carbon (SiGeC) and base layer segments 234 and 236 may comprise polycrystalline SiGeC. Base layer 230 forms a base of a bipolar transistor, such as a self-aligned NPN transistor.

Base layer 230 can be formed by using a non-selective epitaxial SiGe deposition process to deposit a layer of SiGe over substrate 208 in CMOS region 206 and bipolar region 212. In the non-selective epitaxial SiGe deposition process, epitaxial SiGe is formed on exposed silicon surfaces, such as top surface 224 of substrate 208, while polycrystalline SiGe is formed over oxide areas, such as isolation regions 220a through 220e. After the layer of SiGe has been formed in CMOS region 206 and bipolar region 212 of substrate 208, a base poly mask is formed to define base layer 230 by covering a portion of the SiGe layer in bipolar region 212. The portions of the SiGe layer that are not protected (i.e. covered) by the base poly mask are then removed by using an appropriate etch process. After the unprotected portions of the SiGe layer have been removed, the remaining portions of sacrificial oxide layer 222 (shown in FIG. 2B) are also removed in an appropriate etch process.

At this point in the present invention's BiCMOS process flow, a base layer (i.e. base layer 230) has been formed in bipolar region 212 of substrate 208 prior to formation of transistor gates, such as PFET and NFET gates, in CMOS region 206 of substrate 208. In contrast, in a convention BiCMOS process flow, transistor gates are formed in a CMOS region of a substrate before a base layer is formed in a bipolar region of the substrate. By forming the base layer in the bipolar region of the substrate prior to formation of transistor gates in the CMOS region of the substrate, the present invention's BiCMOS process flow advantageously allows a sufficiently high thermal budget as required for transistor base formation without undesirably affecting FET junction profiles. The result of step 174 of flowchart 100 is illustrated by structure 274 in FIG. 2C.

Figure 2D:
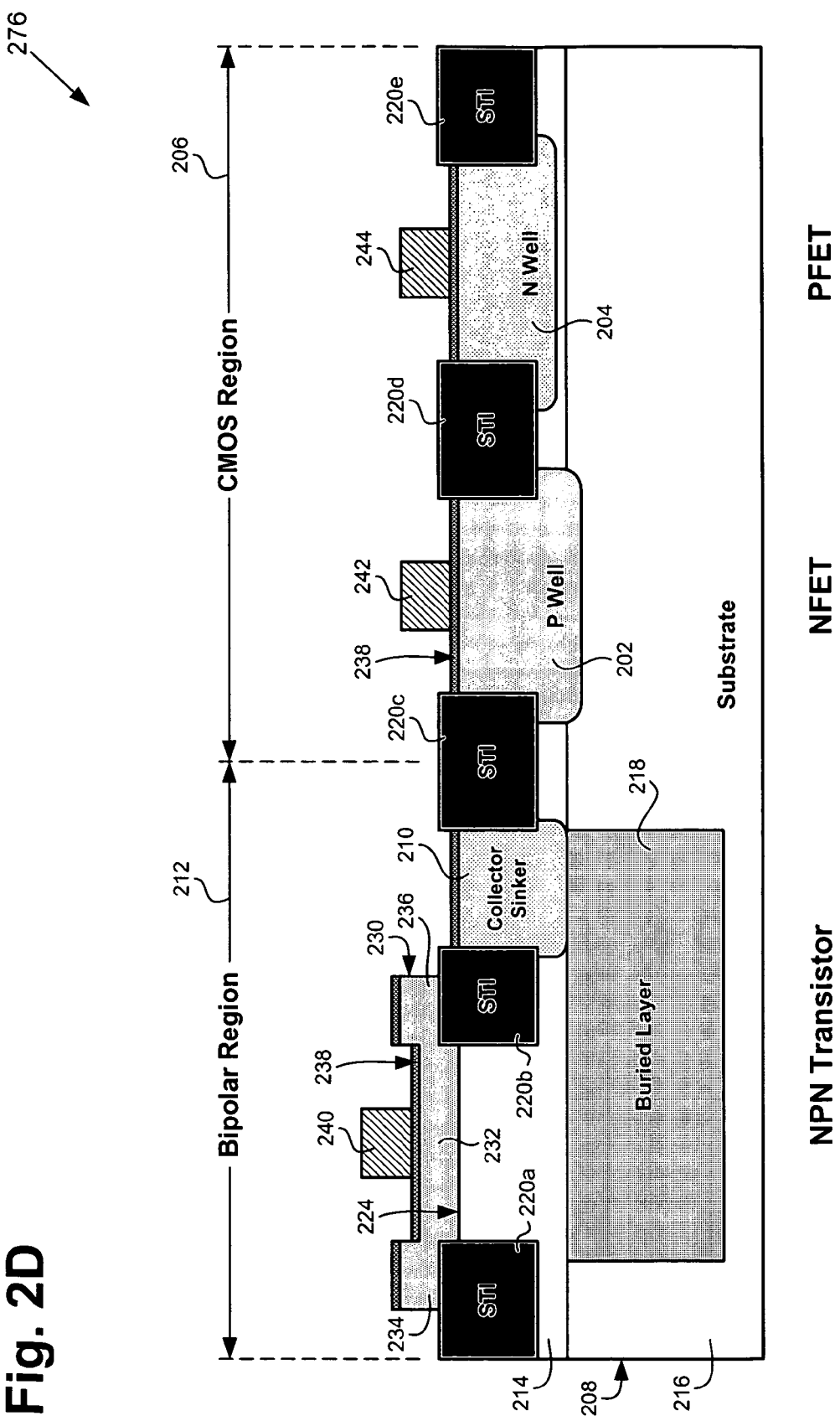
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, dielectric layer 238 is grown on top surface 224 of substrate 208 in CMOS region 206 and bipolar region 212 and on base layer 230 in bipolar region 212. Dielectric layer 238 is situated over P well 202 and N well 204 in CMOS region 206 and over collector sinker 210 and base layer 230 in bipolar region 206 of substrate 208. Dielectric layer 238 can comprise silicon oxide, which can be grown on exposed silicon surfaces in bipolar region 212 and CMOS region 206 of substrate 208 by using a thermal oxidation process or other appropriate process. Portions of dielectric layer 238 situated in CMOS region 206 form gate dielectrics for a PFET and an NFET, which are subsequently formed in CMOS region 206.

Also at step 176 of flowchart 100, sacrificial post 240 is formed over base layer 230 in bipolar region 212 and gate electrodes 242 and 244 are formed over P well 202 and N well 204, respectively, in CMOS region 206. Sacrificial post 240 is situated over base layer 230 on dielectric layer 238 in bipolar region 212 and can comprise polycrystalline silicon. Gate electrodes 242 and 244 are situated over P well 202 and N well 204, respectively, on dielectric layer 238 in CMOS region 212 and can also comprise polycrystalline silicon. Gate electrode 242 forms a gate electrode of an NFET, while gate electrode 244 forms a gate electrode of a PFET. The portions of dielectric layer 238 situated underneath gate electrodes 242 and 244 form gate dielectric layers. Sacrificial post 240 and gate electrodes 242 and 244 can be formed by depositing a layer of polycrystalline silicon over substrate 208 in bipolar region 212 and CMOS region 206 by using a low pressure chemical vapor deposition (LPCVD) process, a reduced pressure chemical vapor deposition (RPCVD) process, or other appropriate deposition process. The layer of polycrystalline silicon is then patterned using a common mask and etched using an appropriate etch process to form sacrificial post 240 and gate electrodes 242 and 244. In the present embodiment, the common mask can be a phase shift mask. In one embodiment, the common mask can be a type of mask other than a phase shift mask. Since a base layer (i.e. base layer 230) has been formed at a prior process step (i.e. at step 174 of flowchart 100) in the present invention's BiCMOS process flow, sacrificial post 240 and gate electrodes 242 and 244 are formed by using a single common mask. The result of step 176 of flowchart 100 is illustrated by structure 276 in FIG. 2D.

Figure 2E:
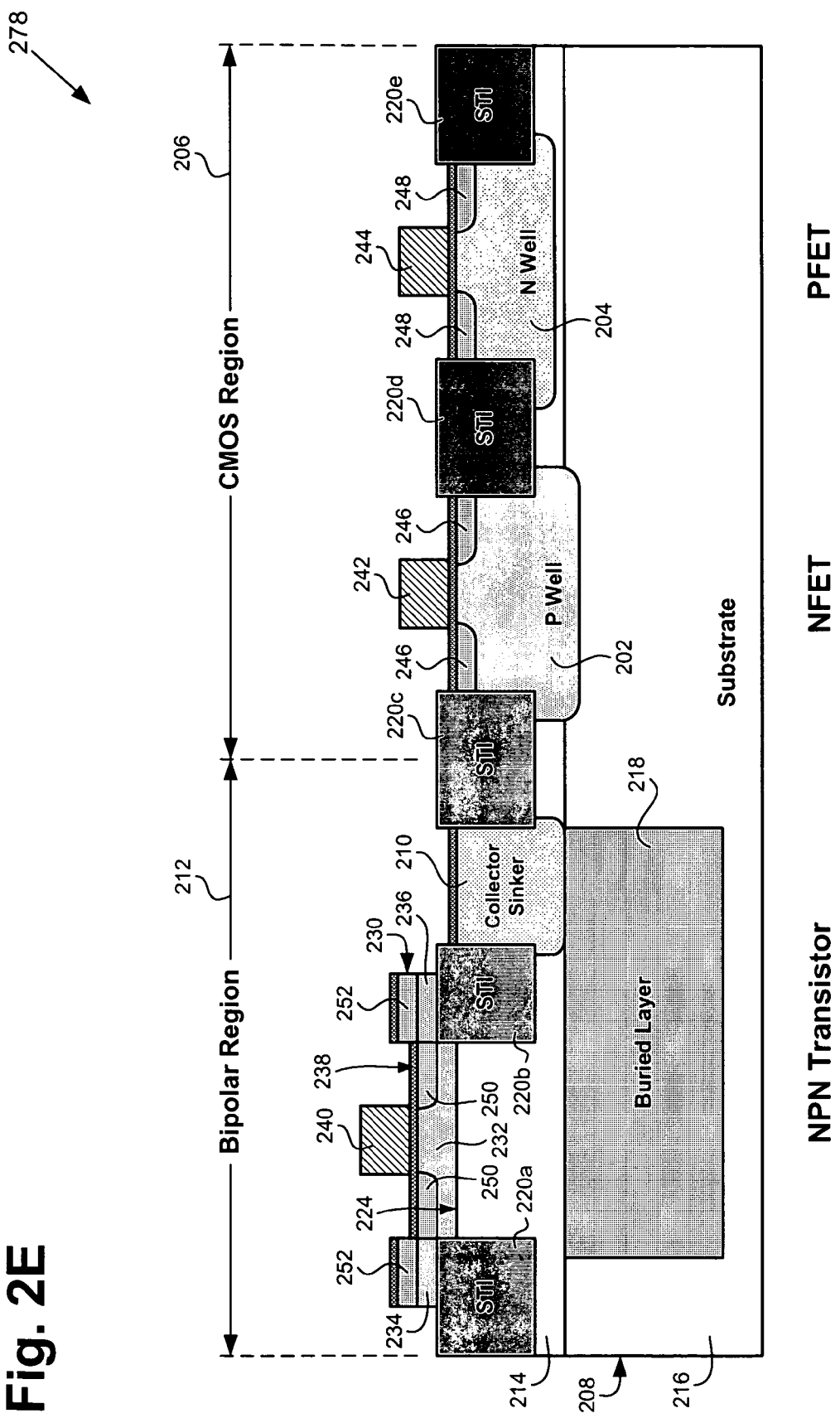
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, LDD regions 246 are formed adjacent to gate electrode 242 and LDD regions 248 are formed adjacent to gate electrode 244 in CMOS region 206, and link base regions 250 and extrinsic base regions 252 are formed adjacent to sacrificial post 240 in bipolar region 212 of substrate 208. LDD regions 246 comprise lightly doped N type regions, LDD regions 248 comprise lightly doped P type regions, and link base regions 250 and extrinsic base regions 252 comprise lightly doped P type regions. LDD regions 248, link base regions 250, and extrinsic base regions 252 can be formed by first forming a pLDD mask to expose an NPN transistor portion of bipolar region 212 including base layer 230 and a PFET portion of CMOS region 206 situated between isolation regions 220d and 220e and to protect the remaining portions of bipolar region 212 and CMOS region 206. A P type implant is then performed to form link and extrinsic base regions 250 and 252 in base layer 230 and LDD regions 248 in N well 204. Link and extrinsic base regions 250 and 252 are self-aligned to sacrificial post 240 and LDD regions 248 are self-aligned to gate electrode 244. The P type implant can comprise boron or other appropriate P type dopant, for example.

LDD regions 246 can be formed by first forming an nLDD mask to expose the NFET portion of CMOS region 206 situated between isolation regions 220c and 220d and to protect bipolar region 212 and the remaining portion of CMOS region 206. An N type implant, which can comprise phosphorus or other appropriate N type dopant, is then performed in the exposed portion of CMOS region 206 to form LDD regions 246, which are self-aligned to gate electrode 242. The result of step 178 of flowchart 100 is illustrated by structure 278 in FIG. 2E.

Figure 2F:
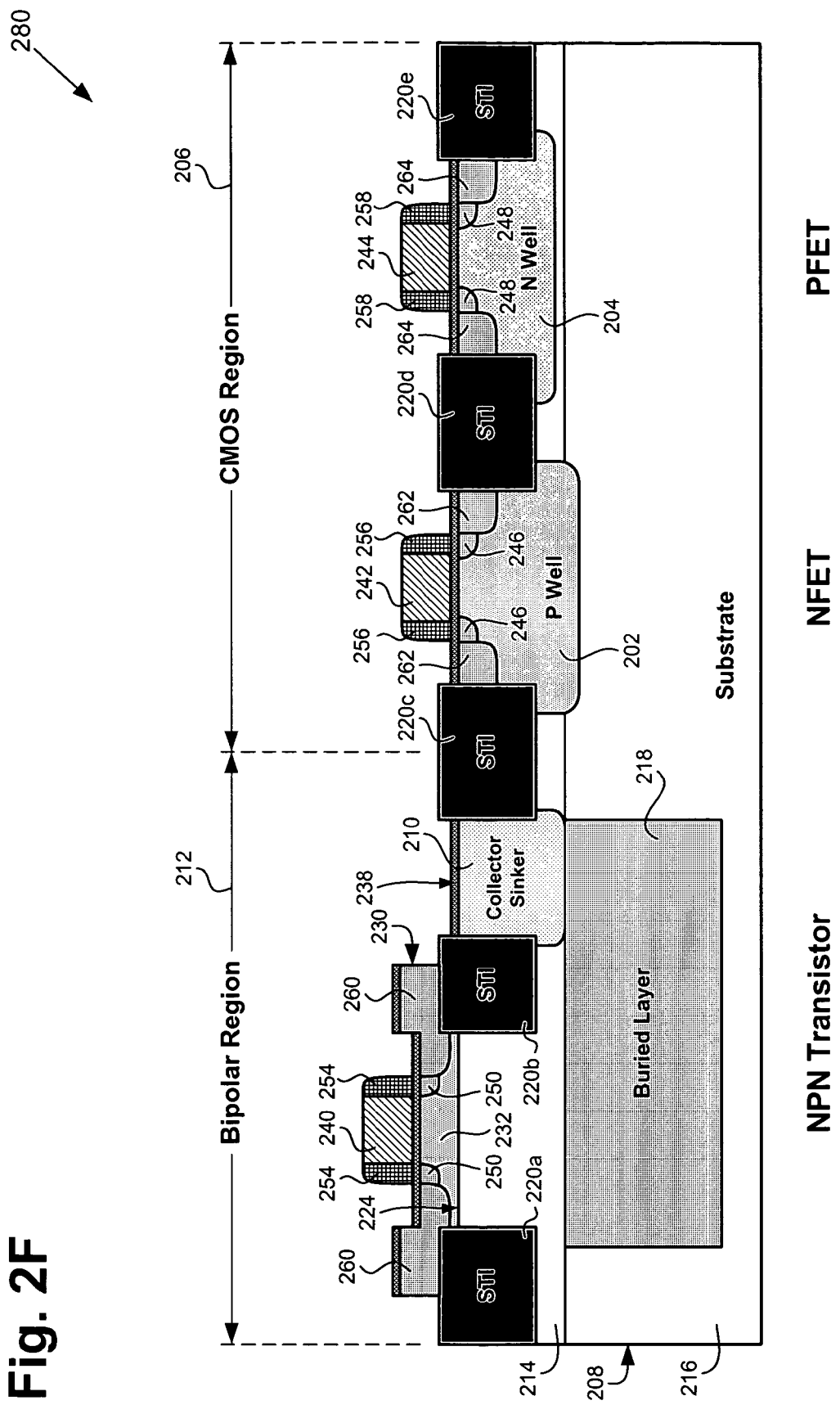
FIG. 2F illustrates a cross-sectional view, which includes a portion of a wafer processed according to an embodiment of the invention, corresponding to a final step in the flowchart in FIG. 1.

Referring to step 180 in FIG. 1 and structure 280 in FIG. 2F, at step 180 of flowchart 100, spacers 254 are formed in bipolar region 212 and spacers 256 and 258 are formed in CMOS region 206 of substrate 208. Spacers 254 are situated adjacent to sacrificial post 240 and over base layer 230 in bipolar region 212. Spacers 256 are situated adjacent to gate electrode 242 and over P well 202 and spacers 258 are situated adjacent to gate electrode 244 and over N well 204 in CMOS region 206. Spacers 254, 256, and 258 can comprise silicon oxide, silicon nitride, or other appropriate dielectric material. Spacers 254, 256, and 258 can be formed by depositing a conformal layer of dielectric material, such as silicon oxide or silicon nitride, over bipolar region 212 and CMOS region 206 of substrate 208. The layer of dielectric material can then be "etched back" using an anisotropic etch process to form spacers 254, 256, and 258.

Also at step 180 of flowchart 100, heavily doped extrinsic base regions 260 are formed in bipolar region 212 and source/drain regions 262 and 264 are formed in CMOS region 206 of substrate 208. Heavily doped extrinsic base regions 260 are situated in base layer 230 adjacent to spacers 254 in bipolar region 212, source/drain regions 262 are situated in P well 202 adjacent to spacers 256 in CMOS region 206, and source/drain regions 264 are situated in N well 204 adjacent to spacers 258 in CMOS region 206. Heavily doped extrinsic base regions 260 and source/drain regions 264 can be formed by first forming a P type implant mask to expose the NPN transistor portion of bipolar region 212 including base layer 230 and the PFET portion of CMOS region 206 situated between isolation regions 220d and 220e and to cover the remaining portions of bipolar region 212 and CMOS region 206. A P type implant comprising a high concentration of boron or other appropriate P type dopant is then performed to form heavily doped extrinsic base regions 260 in base layer 230 and source/drain regions 264 in N well 204. Heavily doped extrinsic base regions 260 are self-aligned to gate electrode 244, while source/drain regions 264 are self-aligned to gate electrode 244.

Source/drain regions 262 can be formed by first forming an N type implant mask to expose the NFET portion of CMOS region 206 and cover bipolar region 212 and the remaining portions of CMOS region 206. An N type implant comprising a high concentration of phosphorus or other appropriate N type dopant is then performed to form source/drain regions 262 in P well 202. Source/drain regions 262 are self-aligned to gate electrode 242. The result of step 180 of flowchart 100 is illustrated by structure 280 in FIG. 2F.

Figure 2G:
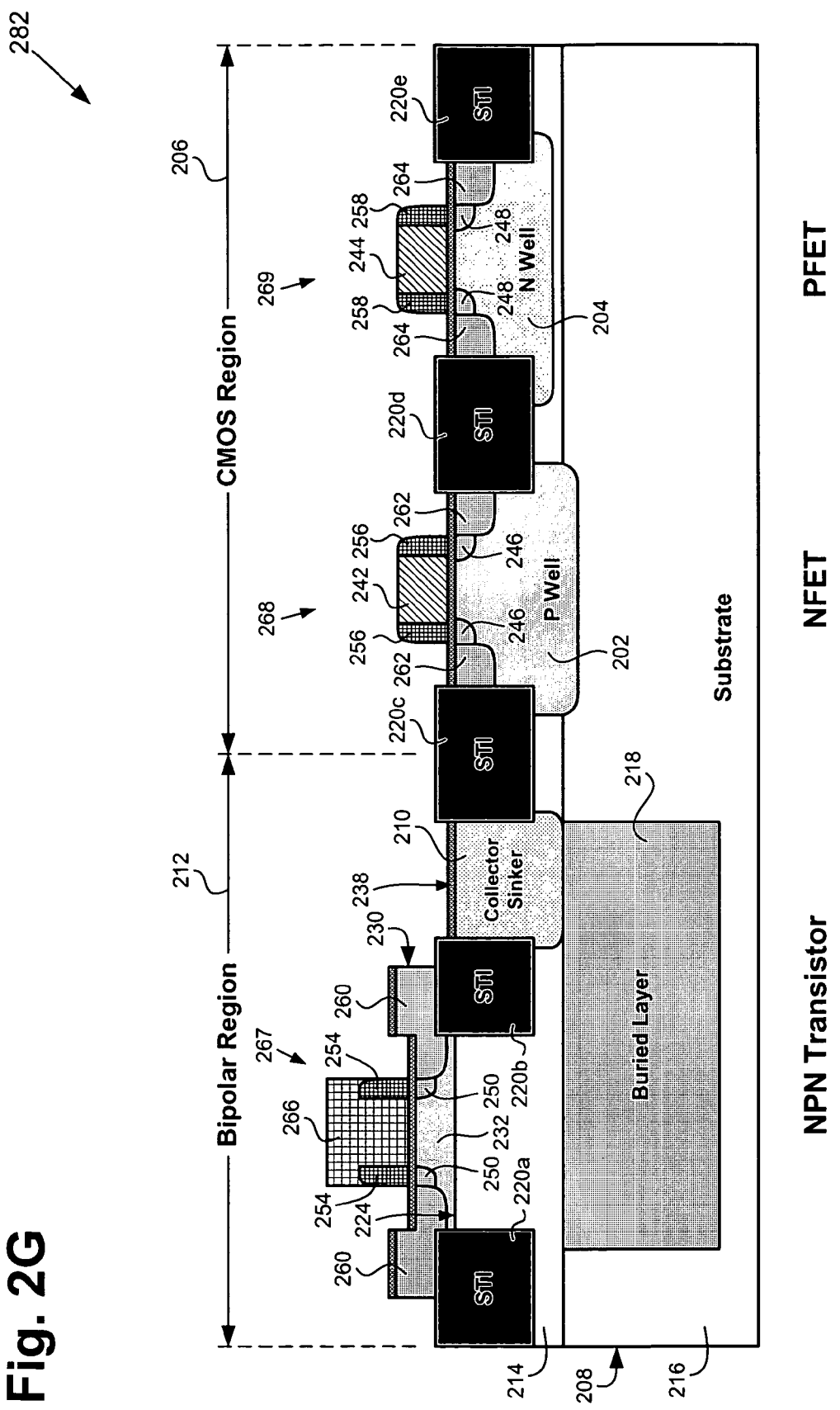
FIG. 2G illustrates a cross-sectional view, which includes a portion of a wafer processed according to an embodiment of the invention, corresponding to a final step in the flowchart in FIG. 1.

Referring to step 182 in FIG. 1 and structure 282 in FIG. 2G, at step 182 of flowchart 100, sacrificial post 240 is removed in the NPN transistor portion of bipolar region 212 to an emitter window opening and emitter 266 is formed in the emitter window opening. Emitter 266 is situated between spacers 254 and over base layer 230 in the NPN transistor portion of bipolar region 212 and can comprise N type polycrystalline silicon, which can be doped with phosphorus or other appropriate N type dopant. Emitter 266 can be formed by first forming an emitter window mask over substrate 208 to expose sacrificial post 240 (shown in FIGS. 2D, 2E, and 2F) and spacers 254 in bipolar region 212 and to protect CMOS region 206 and the remaining portions of bipolar region 212. Sacrificial post 240 (shown in FIGS. 2D, 2E, and 2F) can then be removed to form an emitter window opening by using an appropriate etch process that is selective to silicon nitride and silicon oxide. A layer of polycrystalline material, which can comprise N type polycrystalline silicon, can be deposited over bipolar region 212 and CMOS region 206 of substrate 208 after removal of the emitter window mask. An emitter poly mask can then be formed to protect a portion of the layer of polycrystalline material situated in the emitter window opening and over spacers 254 in bipolar region 212 and to expose the remaining portion of the layer of polycrystalline material situated in bipolar region 212 and CMOS region 206. Emitter 266 can then be formed by removing the exposed portion of the layer of polycrystalline material in an appropriate etch process.

Thus, as a result of the present invention's BICMOS process flow, self-aligned NPN transistor 267, which includes emitter 266, base layer 230, and a collector situated between base layer 230 and buried layer 218, is formed in bipolar region 212, and NFET 268, which includes gate electrode 242 and source/drain regions 262, and PFET 269, which includes gate electrode 244 and source/drain regions 264, are formed in CMOS region 206 of substrate 208. The result of step 182 of flowchart 100 is illustrated by structure 282 in FIG. 2G.

Thus, as discussed above, by forming the base layer in the bipolar region of the substrate prior to formation of transistor gates in the CMOS region of the substrate, the present invention's BiCMOS process flow allows a sufficiently high thermal budget as required for transistor base formation without undesirably affecting FET junction profiles. Thus, the present invention's BiCMOS process flow advantageously achieves an integration of bipolar and FET devices on a substrate.

Also, as discussed above, by forming the base layer in the bipolar region of the substrate prior to formation of transistor gates in the CMOS region of the substrate, the present invention's BiCMOS process flow advantageously forms a sacrificial post in a bipolar region of the substrate and gate electrodes in a CMOS region of the substrate by using a common mask. In contrast, in a conventional BiCMOS process flow, since the gate electrodes are formed before the base layer, one mask is required to form a sacrificial post in a bipolar region of a substrate and another mask is required to form gate electrodes in a CMOS region of the substrate. Thus, the present invention's BiCMOS process flow advantageously achieves a reduction in required masks and, consequently, a reduction in process steps and cost compared to a conventional BiCMOS process flow.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for effective BiCMOS process integration has been described.

The invention claimed is:

1. A method for integrating bipolar and CMOS devices on a substrate, said substrate including a bipolar region and a CMOS region, said substrate having a sacrificial oxide layer situated thereon, said method comprising steps of:
    removing a portion of said sacrificial oxide layer in said bipolar region of said substrate to expose a top surface of said substrate;
    forming a base layer on said top surface of said substrate in said bipolar region;
    forming a sacrificial post on said base layer in said bipolar region and at least one gate electrode in said CMOS region of said substrate;
    wherein said base layer forms a bipolar transistor base, and wherein said base layer is formed prior to formation of said at least one gate electrode in said CMOS region of said substrate.

2. The method of claim 1 wherein said step of forming said sacrificial post comprises using a common mask to form said sacrificial post and said at least one gate electrode.

3. The method of claim 1 wherein said base layer comprises epitaxial silicon-germanium.

4. The method of claim 1 further comprising a step of forming LDD regions adjacent to said at least one gate electrode in said CMOS region.

5. The method of claim 1 further comprising a step of forming spacers adjacent to said sacrificial post in said bipolar region and adjacent to said at least one gate electrode in said CMOS region.

6. The method of claim 5 further comprising a step of forming source/drain regions adjacent to said at least one gate electrode in said CMOS region.

7. The method of claim 6 further comprising steps of:
removing said sacrificial post to form an emitter window opening;
forming an emitter in said emitter window opening.

8. The method of claim 1 further comprising a step of growing a dielectric layer in said bipolar region and said CMOS region prior to said step of forming said sacrificial post, wherein said dielectric layer forms a gate dielectric in said CMOS region.

9. The method of claim 1 wherein said base layer comprises epitaxial silicon-germanium-carbon.

10. The method of claim 1 wherein said bipolar transistor base is a self-aligned NPN transistor base.

11. A method for integrating bipolar and CMOS devices on a substrate, said substrate including a bipolar region and a CMOS region, said substrate having a sacrificial oxide layer situated thereon, said method comprising steps of:
removing a portion of said sacrificial oxide layer in said bipolar region of said substrate to expose a top surface of said substrate;
forming a base layer on said top surface of said substrate in said bipolar region;
forming a sacrificial post on said base layer in said bipolar region and an NFET gate electrode and a PFET gate electrode in said CMOS region of said substrate;
wherein said step of forming said sacrificial post comprises using a common mask to form said sacrificial post and at least one gate electrode in a CMOS region of said substrate, and wherein said base layer is formed prior to formation of said at least one gate electrode in said CMOS region of said substrate.

12. The method of claim 11 wherein said base layer is an NPN transistor base.

13. The method of claim 11 wherein said base layer comprises epitaxial silicon-germanium.

14. The method of claim 11 wherein said base layer comprises epitaxial silicon-germanium-carbon.

15. The method of claim 1 further comprising a step of forming extrinsic base regions adjacent to said sacrificial post in said bipolar region and P type LDD regions adjacent to said PFET gate electrode in said CMOS region.

16. The method of claim 15 further comprising a step of forming N type LDD regions adjacent to said NFET gate electrode in said CMOS region.

17. The method of claim 11 further comprising a step of forming spacers adjacent to said sacrificial post in said bipolar region and adjacent to said NFET gate electrode and said PFET gate electrode in said CMOS region.

18. The method of claim 17 further comprising steps of:
removing said sacrificial post to form an emitter window opening;
forming an emitter in said emitter window opening.

19. The method of claim 11 further comprising a step of growing a dielectric layer in said bipolar region and said CMOS region prior to said step of forming said sacrificial post, wherein said dielectric layer forms a gate dielectric in said CMOS region.

20. The method of claim 11 wherein said common mask is a phase shift mask.

\* \* \* \* \*